(12) United States Patent
Hasegawa

(10) Patent No.: US 7,956,682 B2
(45) Date of Patent: Jun. 7, 2011

(54) AMPLIFIER

(75) Inventor: Nobumasa Hasegawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/702,349

(22) Filed: Feb. 9, 2010

(65) Prior Publication Data

US 2010/0201449 A1    Aug. 12, 2010

(30) Foreign Application Priority Data

Feb. 9, 2009   (JP) .................................. 2009-026988

(51) Int. Cl.
    *H03F 1/14*    (2006.01)
(52) U.S. Cl. .......................................... 330/51; 330/311
(58) Field of Classification Search .................... 330/51, 330/311, 310, 285, 296
    See application file for complete search history.

(56) References Cited

U.S. PATENT DOCUMENTS

| | | | | |
|---|---|---|---|---|
| 4,940,949 A | * | 7/1990 | Landi | 330/262 |
| 6,498,533 B1 | * | 12/2002 | Sowlati | 330/98 |
| 6,987,422 B2 | * | 1/2006 | Vice | 330/285 |
| 7,791,411 B2 | * | 9/2010 | Frohlich et al. | 330/98 |
| 2007/0046379 A1 | | 3/2007 | Tanahashi et al. | |
| 2008/0297262 A1 | * | 12/2008 | Duster et al. | 330/311 |

FOREIGN PATENT DOCUMENTS

| | | |
|---|---|---|
| JP | 8-148953 A | 6/1996 |
| JP | 11-112381 A | 4/1999 |
| JP | 2007-60458 A | 3/2007 |

* cited by examiner

*Primary Examiner* — Henry K Choe
(74) *Attorney, Agent, or Firm* — Fujitsu Patent Center

(57) ABSTRACT

An amplifier including a first transistor including a gate coupled to an input terminal and a grounded source; a load resistor provided between a drain of the first transistor and a power supply; an output terminal coupled to a node between the drain of the first transistor and the load resistor; a feedback path coupled to the input terminal and the output terminal and including a resistor and a capacitor; a bias voltage generator applying a gate bias voltage to the gate of the first transistor in response to an enable signal; a supply resistor provided between an output node for the gate bias voltage of the bias voltage generator and the gate of the first transistor; and an enable switch lowering a resistance value between the output node for the gate bias voltage and a node in the feedback path.

16 Claims, 17 Drawing Sheets

FIG.2 LNA

AMPLIFIER

CROSS-REFERENCE TO RELATED APPLICATION

This application is based upon and claims the benefit of priority of the prior Japanese Patent Application No. 2009-026988 filed on Feb. 9, 2009, the entire contents of which are incorporated herein by reference.

FIELD

The embodiments discussed herein are related to an amplifier.

BACKGROUND

Generally, an amplifier operates to amplify the amplitude of an input signal, such as a high frequency signal. For example, a radio communication apparatus includes a low noise amplifier (LNA) for amplifying a high frequency signal received at an antenna. The signal received at the antenna passes through a filter provided on the reception side and is amplified by the LNA.

The input impedance of an amplifier for amplifying a high frequency signal, such as the LNA described above, is typically limited in the specifications of the amplifier. For example, when the output impedance of an element provided in the preceding stage of the amplifier is 50Ω, the input impedance of the amplifier is also desirably matched to 50Ω. As a result, the high frequency signal input to the amplifier may obtain a maximum electric power.

The amplifier includes a supply resistor for supplying a gate bias voltage to an input terminal. Generally, a noise figure (NF), which indicates how much the amplifier is affected by thermal noise of the supply resistor, is desired to be as small as possible.

To meet the requirements for matching an impedance and lowering the NF as described above, the amplifier includes a feedback path between an output terminal and the input terminal in addition to the supply resistor of the gate bias voltage, which has a given resistance value.

Examples of typical amplifiers include an amplifier that stably operates in transmission and reception states, a cascode-coupled high frequency amplifier, and an amplifier that operates as an output amplifier on the transmission side having multiple stages so that elements on the reception side may not be affected by a signal from the transmission side when the transmission and reception states are switched in a radio communication apparatus.

When the amplifier is switched from the transmission state to the reception state, the bias voltage starts to be supplied in the amplifier. After that, when a direct current (DC) voltage corresponding to a node in the amplifier becomes stable, the amplifier starts to perform desired operations for the signal reception.

However, it may take more time than desired for the amplifier including the feedback path between the output terminal and the input terminal to reach a stable state after the bias voltage has started to be supplied.

SUMMARY

According to an aspect of the embodiments, an amplifier includes a first transistor including a gate coupled to an input terminal and a grounded source, a load resistor provided between a drain of the first transistor and a power supply, an output terminal coupled to a node between the drain of the first transistor and the load resistor, a feedback path coupled to the input terminal and the output terminal and including a resistor and a capacitor, a bias voltage generator applying a gate bias voltage to the gate of the first transistor in response to an enable signal, a supply resistor provided between an output node for the gate bias voltage of the bias voltage generator and the gate of the first transistor, and an enable switch lowering a resistance value between the output node for the gate bias voltage and a node in the feedback path.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
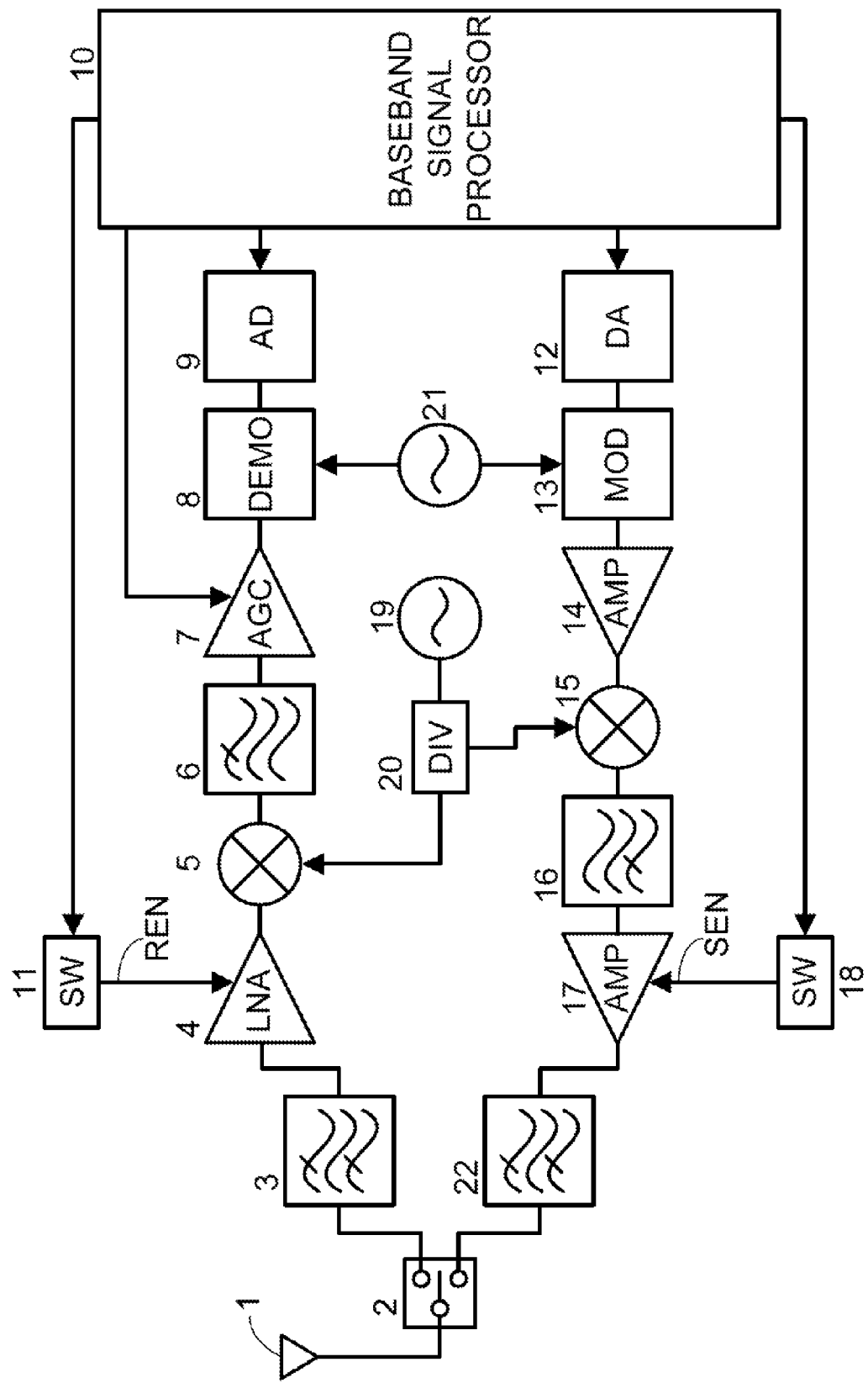
FIG. 1 illustrates a communication apparatus in which an amplifier according to an embodiment is used.

FIG. 1 illustrates a communication apparatus in which an amplifier according to an embodiment is used. A high frequency signal received at an antenna 1 is input to a filter 3 on the reception side through a switch 2 for switching transmission and reception states. The filter 3 passes the signal when the signal is within a desired reception band. The high frequency signal allowed to pass through the filter 3 is amplified by a low noise amplifier (LNA) 4. The signal amplified by the LNA 4 is multiplied with a carrier signal generated by a local oscillator 19 and the resultant frequency is down-converted at a mixer 5. A signal (e.g., a image signal) is removed by a low pass filter 6. The down-converted signal is amplified by a variable gain amplifier 7 to obtain a given gain. Further, the down-converted signal is demodulated by a demodulator 8 based on a signal generated by a local oscillator 21 and is converted to a digital signal by an analog-to-digital converter 9. The baseband signal processor 10 performs desired operations for the reception of the digital signal, such as decoding, for example. Thus, desired operations are performed on the reception side of the communication apparatus.

Operations performed on the transmission side of the communication apparatus are described below. The digital signal generated by the baseband signal processor 10 by, for example, encoding is converted to an analog signal by a digital-to-analog converter 12 and is modulated by a modulator 13 based on a signal generated by the local oscillator 21. The modulated signal is amplified by an amplifier 14. The signal amplified by the amplifier 14 is multiplied with a carrier signal generated by a local oscillator 19 and the resultant frequency is up-converted at a mixer 15. A signal (e.g., an image signal) is removed by a high pass filter 16 and the resultant signal is amplified by an output amplifier 17. A filter 22 on the transmission side passes the signal when the signal is within a desired transmission band. The signal amplified by the output amplifier 17 and allowed to pass through the filter 22 passes through the switch 2 and is transmitted from the antenna 1.

The baseband signal processor 10 performs desired operations for the transmission of the signal by, for example, causing the transmission amplifier 17 to be enabled based on a transmission enable signal SEN from a switch controller 18. Further, the baseband signal processor 10 performs desired operations for the reception of the signal by, for example, causing the transmission amplifier 17 to be disabled and causing the LNA to be enabled based on a reception enable signal REN from a switch controller 11. When the time that it takes for the LNA to transition from the disabled state to the enabled state based on the reception enable signal REN is shortened, the interval between a series of the transmission operations and a series of the reception operations, which is called the "guard time," may be shortened as well.

Figure 2:
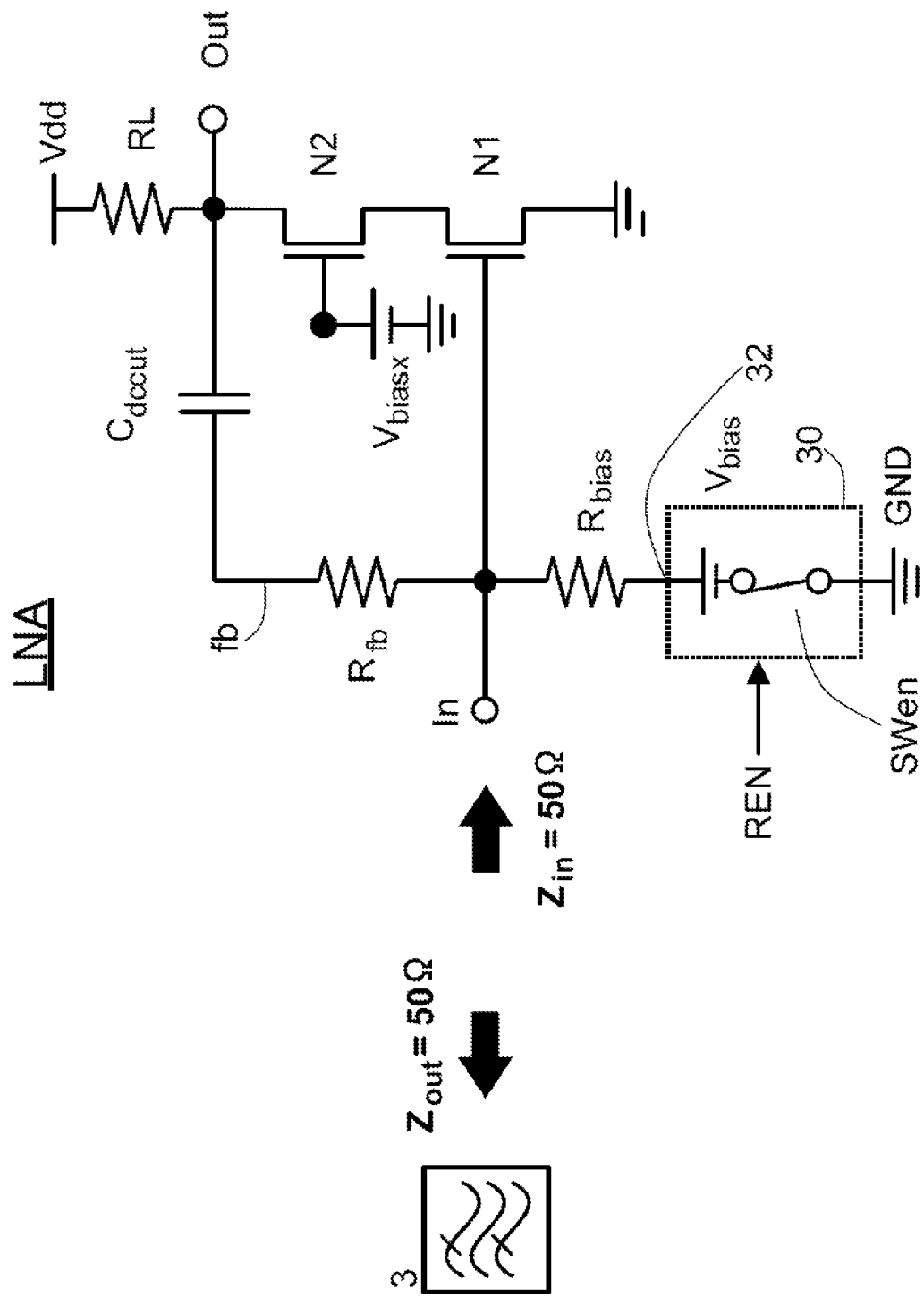
FIG. 2 illustrates the low noise amplifier (LNA) in FIG. 1 as an example of an amplifier according to an embodiment.

FIG. 2 illustrates the low noise amplifier (LNA) in FIG. 1 as an example of an amplifier according to an embodiment. The LNA includes an input terminal In, a first transistor N1 (a source-grounded transistor N1), a second transistor N2 (a gate-grounded transistor N2), a load resistor RL, an output terminal Out, a feedback path fb, a bias voltage generator 30, and a supply resistor $R_{bias}$. The input terminal In receives a high frequency signal. The gate of the first transistor N1 is coupled to the input terminal In and the source of the first transistor N1 is grounded. The second transistor N2 is cascode-coupled to the drain of the first transistor N1 and a given bias voltage $V_{biasx}$ is supplied to the gate of the second transistor N2. The load resistor RL is provided between the drain of the first transistor N1 and a power source Vdd. The output terminal Out is coupled to a node located between the drain of the first transistor N1 and the load resistor RL, that is, a node located between the drain of the second transistor N2 and the load resistor RL. The feedback path fb is coupled to the input terminal In and the output terminal Out and includes a resistor $R_{fb}$ and a capacitor $C_{dccut}$. In response to the reception enable signal REN, the bias voltage generator 30 generates a gate bias voltage $V_{bias}$ applied to the first transistor N1. The supply resistor $R_{bias}$ is provided between a gate bias voltage output node of the bias voltage generator 30 and the gate of the first transistor N1.

As described above, the LNA is a cascode amplifier including the source-grounded transistor N1 and the gate-grounded transistor N2. Further, the LNA is a circuit that initially amplifies the high frequency signal received at the antenna 1 in FIG. 1 and allowed to pass through the filter 3 on the reception side. When an output impedance $Z_{out}$ of the filter 3 is 50Ω, an input impedance $Z_{in}$ is desirably matched to 50Ω. When the input impedance $Z_{in}$ is matched to 50Ω, the LNA may input the high frequency signal with a desired power.

Generally, the input impedance $Z_{in}$ may be expressed by the following equation:

$$Z_{in}=Zf/(A-1)$$

where "Zf" represents an impedance of the feedback path fb and "A" represents a gain of the LNA. Since the gain "A" is the product of a transconductance gm of the transistor N1 and the load resistor RL, the gain "A" may be expressed by the following equation:

$$A=gm \times RL.$$

According to the equation above, $Z_{in}=Zf/(A-1)$, the value of the impedance Zf of the feedback path fb is desirably suited to cause the input impedance $Z_{in}$ to be approximately 50Ω. Without the feedback path fb, the impedance Zf would be infinite and it would be difficult to match the input impedance $Z_{in}$ to 50Ω. Therefore, the feedback path fb is desirably provided to match the input impedance $Z_{in}$ to a given value, and the resistance value of the resistor $R_{fb}$ in the feedback path fb is desirably suited for the given value.

The high frequency signal supplied to the input terminal In has a direct current (DC) bias level based on the gate bias voltage $V_{bias}$. The amplified and generated high frequency signal that the output terminal Out receives has a DC bias level that differs from the DC bias level based on the gate bias voltage $V_{bias}$. When the resistor $R_{fb}$ having a desired resistance value is provided in the feedback path fb, the DC bias level corresponding to the input terminal In and the DC bias level corresponding to the output terminal Out are desirably separated from each other. Therefore, the capacitor $C_{dccut}$ is desirably provided in the feedback path fb to separate the DC potentials.

The capacitor $C_{dccut}$ is in a short circuit state with respect to high frequency elements. Therefore, the resistor $R_{fb}$ and the capacitor $D_{dccut}$ are desirably coupled in series in the feedback path fb. The resistor $R_{fb}$ may be provided on the side of the output terminal Out and the capacitor $D_{dccut}$ may be provided on the side of the input terminal In.

The supply resistor $R_{bias}$ is described in detail below. The gate bias voltage generator 30 supplies the gate bias voltage $V_{bias}$ to the gate of the source-grounded transistor N1 through the supply resistor $R_{bias}$. Since the gate bias voltage generator 30 may be regarded as being substantially grounded when the terminal In receives a signal having alternating current (AC) characteristics, the input impedance $Z_{in}$ may not be matched to 50Ω with a small resistance value of the supply resistor $R_{bias}$. Therefore, the resistance value of the supply resistor $R_{bias}$ is desirably set to be relatively large, for example, 30 kΩ.

The NF of the LNA is desirably small. As described above, the supply resistor $R_{bias}$ is coupled to the input terminal In. The supply resistor $R_{bias}$ may cause thermal noise. Therefore, to reduce the NF, it is desirable that the LNA is not affected by the thermal noise.

Figure 3:
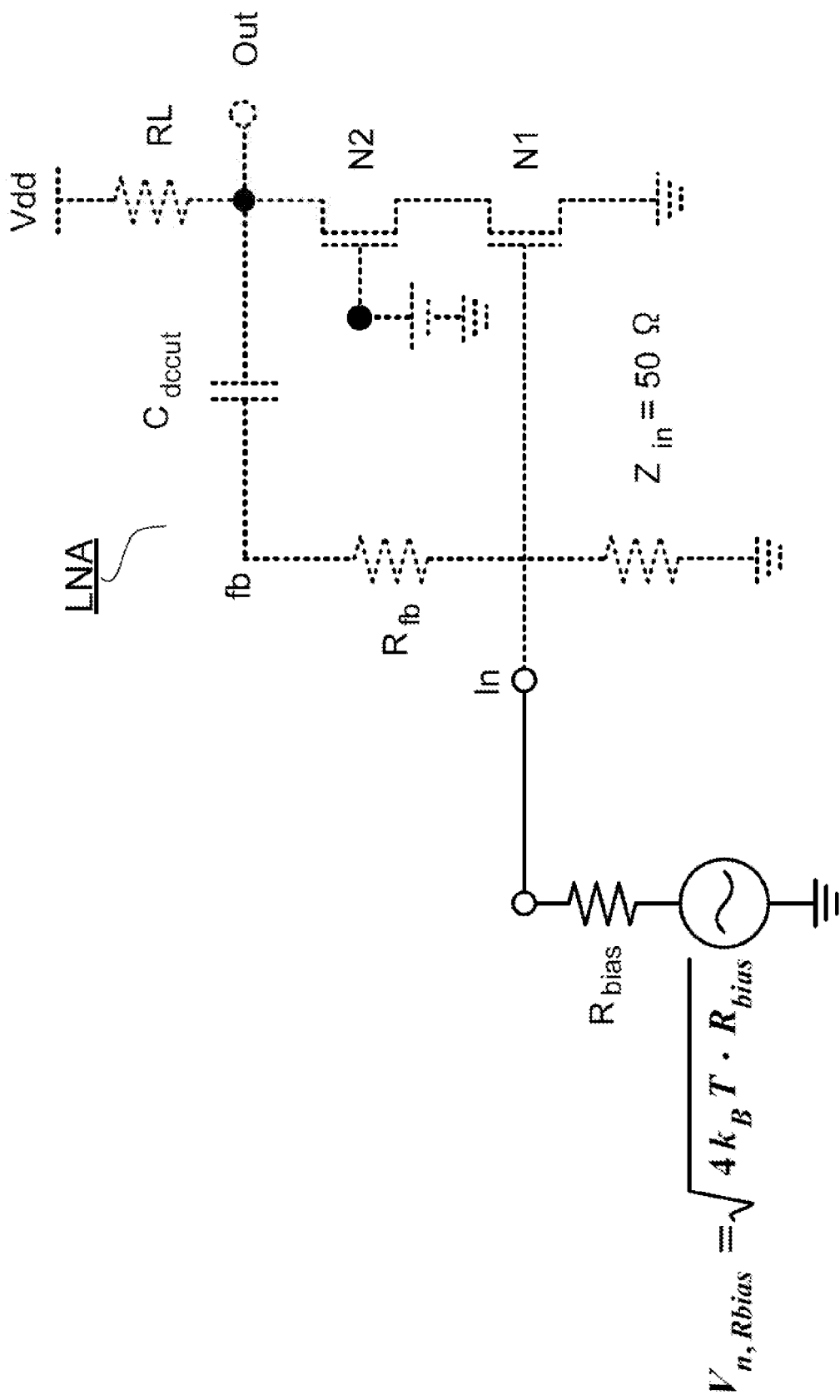
FIG. 3 illustrates how a thermal noise caused by the supply resistor in FIG. 2 affects the LNA in FIG. 2.

FIG. 3 illustrates how the thermal noise caused by the supply resistor $R_{bias}$ affects the LNA in FIG. 2. When, for example, the thermal noise caused by the supply resistor is represented by $V_n$, $R_{bias}$, an equivalent circuit of the supply resistor is realized by coupling the supply resistor $R_{bias}$ and the thermal noise $V_{n, Rbias}$ in series. The value of the thermal noise $V_n$, $R_{bias}$ caused by the supply resistor $R_{bias}$ is represented by $\sqrt{(4 k_B T \cdot R_{bias})}$ as in FIG. 3. When the resistance voltage of the thermal noise $V_{n,Rbias}$ is divided by the supply resistor $R_{bias}$ and the input impedance $Z_{in}$ (=50Ω) that is obtained when the input terminal In is referred to from the element from which a signal is supplied, a voltage Vn,in applied to the input terminal In by the thermal noise $V_{n,Rbias}$ may be expressed by the equation (1) below. The variable T of the equation (1) indicates temperature. The variable kB of the equation (1) indicates Boltzmann constant.

$$Vn, in = \sqrt{4k_B T \cdot Rbias} \cdot \frac{50}{Rbias + 50} \quad (1)$$

$$= \frac{\sqrt{4k_B T} \cdot 50}{\sqrt{Rbias} + \frac{50}{\sqrt{Rbias}}}$$

$$= \begin{cases} 0 & (@Rbias = 0) \\ 0 & (@Rbias = \infty) \end{cases}$$

As expressed in the equation (1), to cause the voltage Vn,in to be zero, the resistance value of the supply resistor $R_{bias}$ is desirably set to be zero or infinite (∞). However, as described above, when the input impedance $Z_{in}$ is 50Ω, the resistance value of the supply resistor $R_{bias}$ may fail to be zero. Therefore, the resistance value of the supply resistor $R_{bias}$ is set to be substantially infinite, for example, approximately 30 kΩ. When the input terminal In is referred to from the element from which a signal is supplied, the supply resistor $R_{bias}$ having a large resistance value may be regarded, in the AC state, as an open circuit and, in the DC state, regarded as a path for supplying the gate bias voltage $V_{bias}$. Thus, when the resistance value of the supply resistor $R_{bias}$ is set to be substantially infinite, the input terminal In may be prevented from suffering the thermal noise $V_{n,Rbias}$ as desired. As a result, the NF of the LNA may be reduced.

As described above, since the input impedance $Z_{in}$ is desirably 50Ω, the feedback path fb and the supply resistor $R_{bias}$ having a high resistance are desirably provided in the LNA. However, when the feedback path fb and the supply resistor $R_{bias}$ are provided in the LNA, it may take more time than desired for the DC voltage of each node in the LNA to become stable in an operating state after the gate bias voltage generator 30 has started to supply the gate bias voltage $V_{bias}$ in response to the reception enable signal REN in FIG. 2. When it takes more time than desired for the DC voltage of each node in the LNA to become stable in the operating state, the transition from the transmission state to the reception state in the radio device may also need more time than desired.

The gate bias voltage generator 30 is illustrated in FIG. 2 simply. A switch SWen becomes conductive in response to the reception enable signal REN and the gate bias voltage generator 30 starts to operate and generate the gate bias voltage $V_{bias}$ to a node 32 coupled to the supply resistor $R_{bias}$.

Figure 4:
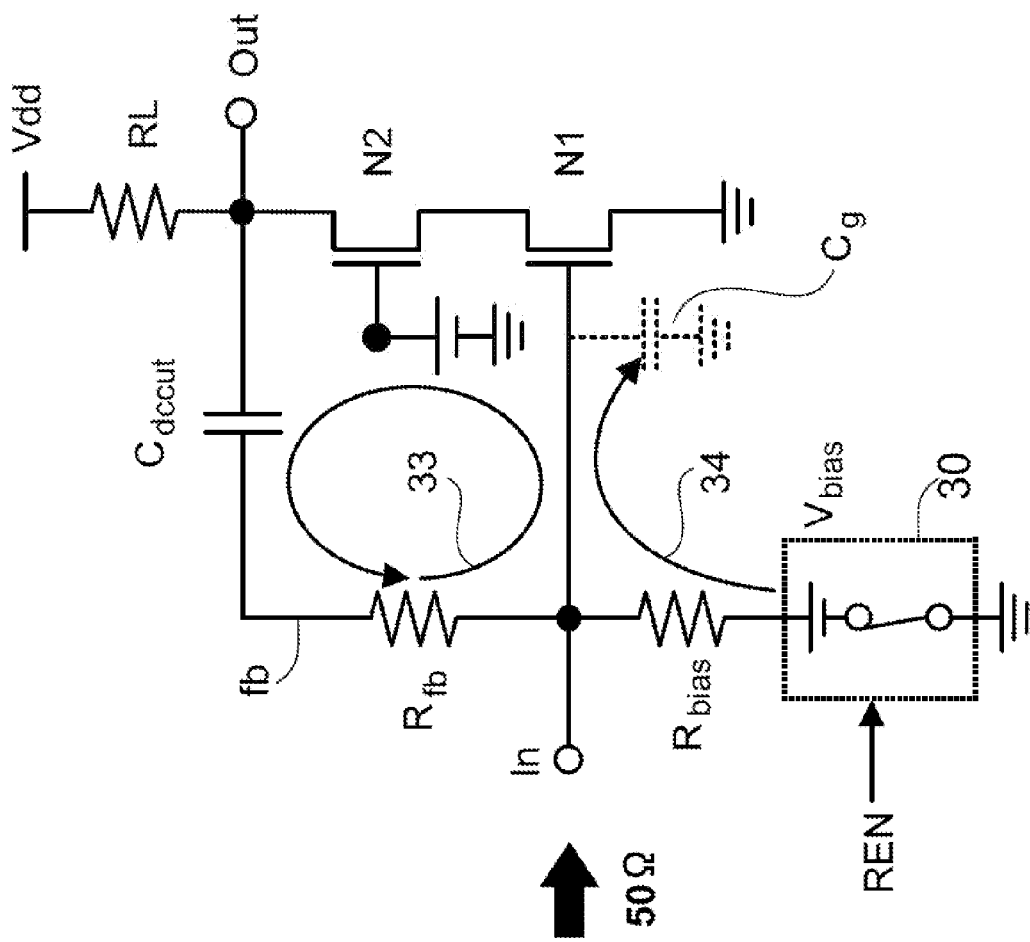
FIG. 4 illustrates a power-up operation of an amplifier according to an embodiment.
Figure 5:
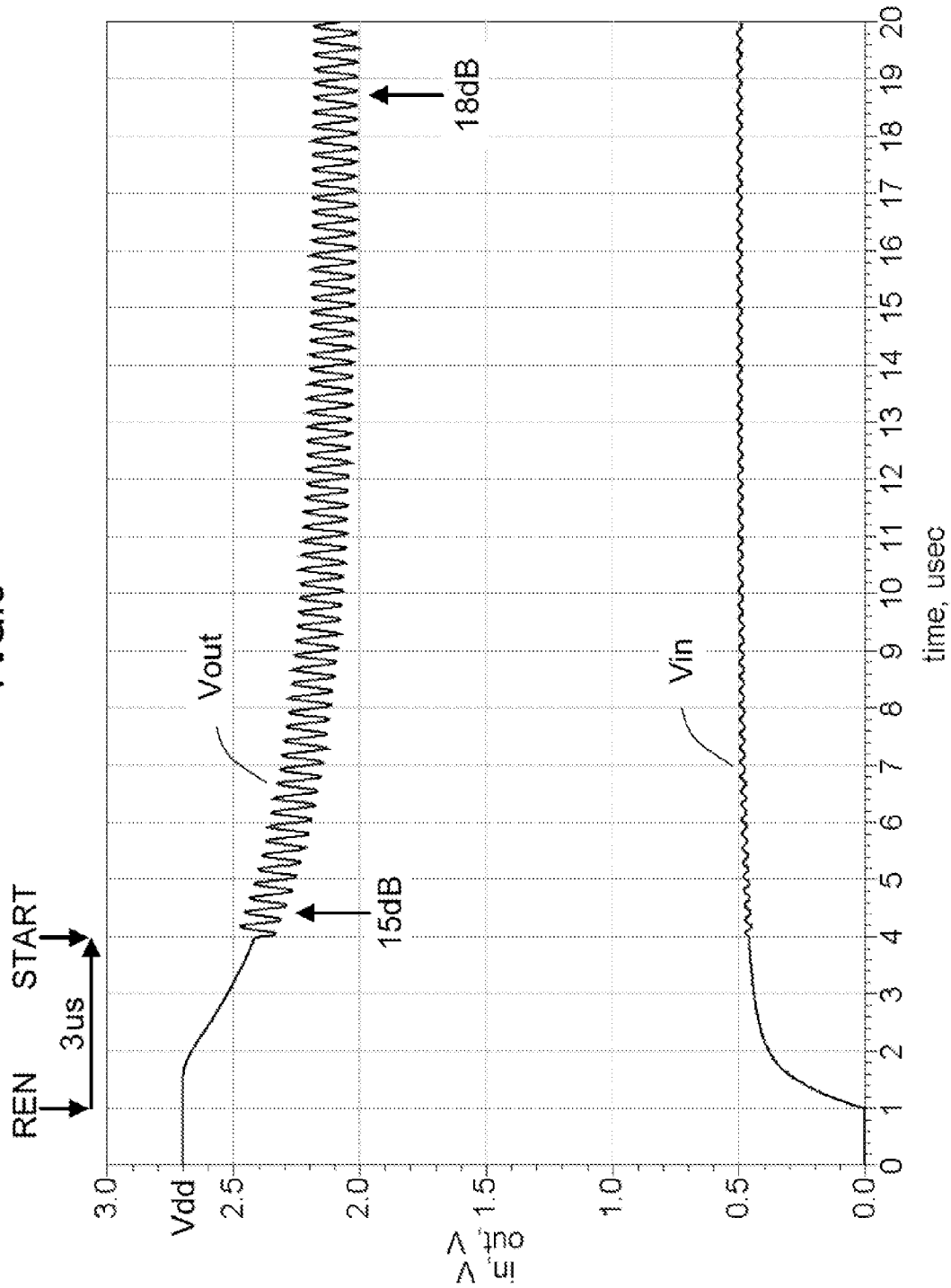
FIG. 5 illustrates voltage characteristics obtained when an amplifier according to an embodiment is powered up.
Figure 6:
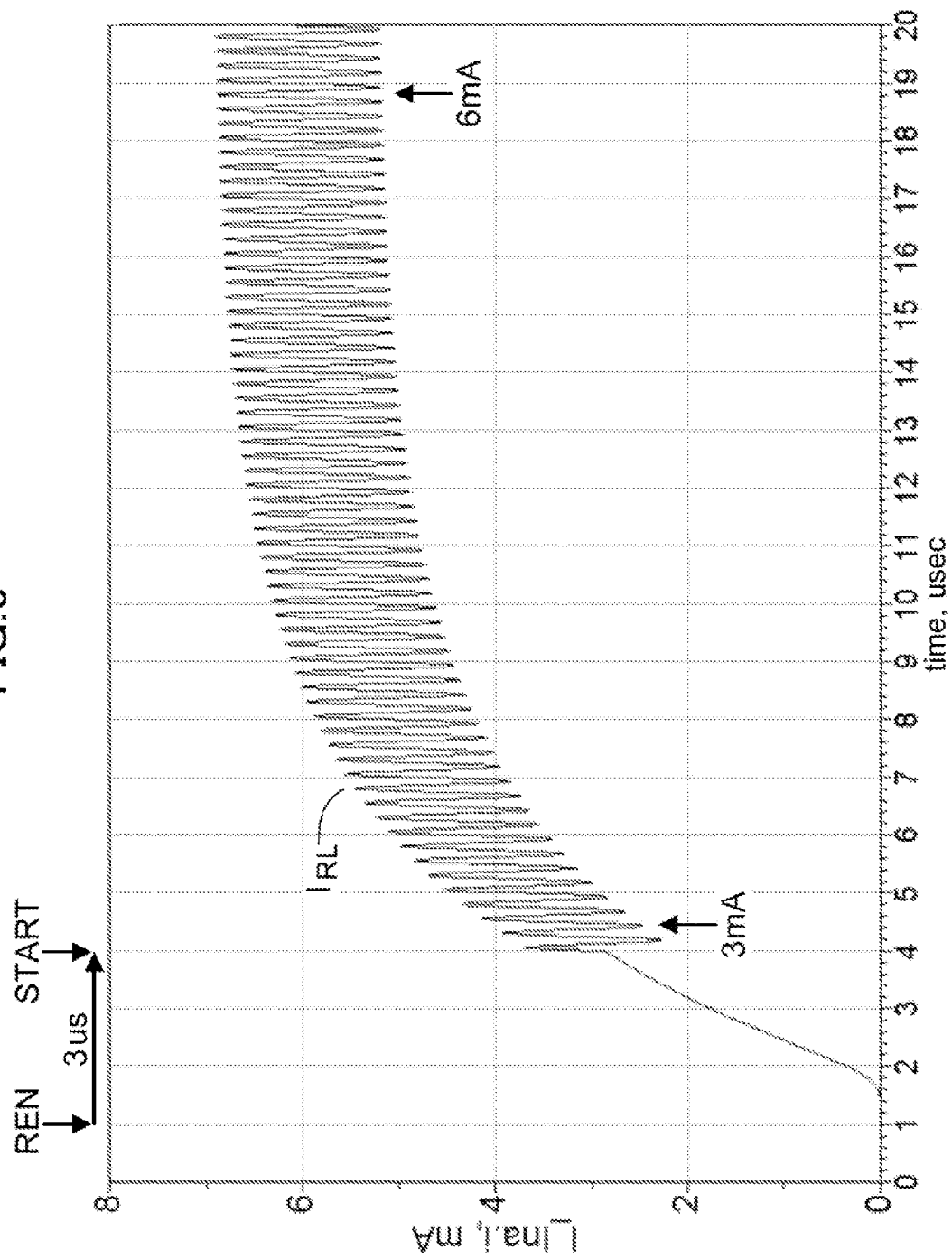
FIG. 6 illustrates current characteristics obtained when an amplifier according to an embodiment is powered up.

FIG. 4 illustrates a power-up operation of an amplifier according to an embodiment. FIG. 5 illustrates voltage characteristics obtained when an amplifier according to an embodiment is powered up. FIG. 6 illustrates current characteristics obtained when an amplifier according to an embodiment amplifier is powered up.

The inventor found that when the LNA in FIG. 2 is used, it takes more time than desired for the DC voltage of each node to become stable as the voltage corresponding to the operating state after the LNA in FIG. 2 receives the reception enable signal REN.

In FIG. 5, the lateral axis indicates time (μsec) and the longitudinal axis indicates voltage (V). FIG. 5 further illustrates an input voltage Vin and an output voltage Vout that are obtained when the reception enable signal REN starts to be supplied at the time of 1 μsec at which the power supply voltage Vdd is 2.7 V.

When the gate bias voltage $V_{bias}$ is not applied, the source-grounded transistor N1 is non-conductive and no current flows across the load resistor RL. At the time of 0 μsec, the power supply voltage Vdd of the output voltage Vout is 2.7 V. When the reception enable signal REN starts to be supplied at the time of 1 μsec, the gate bias voltage $V_{bias}$ increases by approximately 0.5 V and the input voltage Vin also increases. In this simulation, a high frequency signal (4 MHz, amplitude 0.1 V) starts to be supplied at the time of 4 μsec. However, at the time of 4 μsec, the amplitude of the output voltage Vout is still small (15 dB) and the potential level of the output voltage Vout is close to the level of the power supply voltage Vdd. At the time of approximately 19 μsec, the potential of the output voltage Vout is stable and the amplitude of the output voltage Vout is large (18 dB). That is, the gain obtained at the time of 4 μsec is not as large as desired.

Also in FIG. 6, when the gate bias voltage $V_{bias}$ increases and the input voltage Vin increases, a drain current $I_{RL}$ flowing to the load resistor RL increases as well. However, the current $I_{RL}$ is not as large as desired (for example, 3 mA) at the time of 4 μsec at which the amplitude of the current $I_{RL}$ is small. At the time of approximately 19 μsec, the current $I_{RL}$ is large enough (for example, 6 mA) and the amplitude of the current $I_{RL}$ is also large.

When the current $I_{RL}$ is small, a ratio of a signal current to a noise current, that is, a signal to noise ratio (SNR) may be poor. Generally, when the signal current doubles, the noise current becomes √2-fold. For example, when the signal current increases from 3 mA to 6 mA, the √2-fold increase in the noise current may be caused. As a result, the √2-fold improvement in the SNR may be expected.

As demonstrated in FIGS. 5 and 6, at the time of approximately 4 μsec (3 μsec after the reception of the reception enable signal REN), the gain of an amplifier according to an embodiment is still small (for example, 15 dB) and the amplifier is not in the operating state yet for the reasons described below.

The gate bias voltage generator 30 starts to supply the gate bias voltage $V_{bias}$ to the input terminal In and the gate of the transistor N1 through the supply resistor $R_{bias}$, in response to the reception enable signal REN (refer to an arrow 34 in FIG. 4). A parasitic capacitance $C_g$ is present at the gate of the transistor N1 and the parasitic capacitance $C_g$ is charged through the path indicated by the arrow 34 in FIG. 4.

When the gate potential of the transistor N1 increases, the drain current occurs and the potential of the output terminal Out becomes lower than the potential of the power supply voltage Vdd due to a voltage drop caused by the load resistor RL. However, since the feedback path fb is provided, a change in the potential of the output terminal Out is fed back to the side of the input terminal In, and the DC voltage of the path in the loop indicated by an arrow 33 in FIG. 4 oscillates due to the loop indicated by the arrow 33. Thus, it may take more time than desired for an amplifier to reach the operating state.

Figure 7:
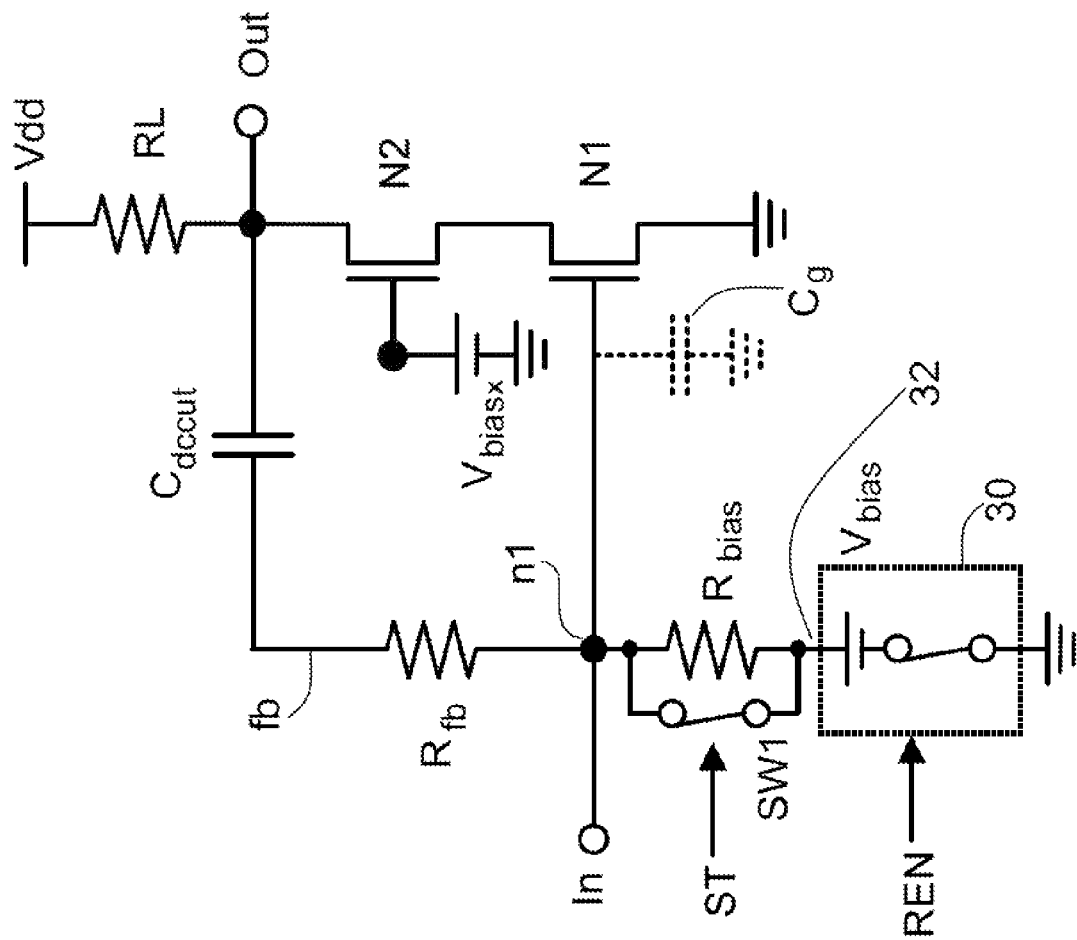
FIG. 7 illustrates an amplifier according to a first embodiment.

FIG. 7 illustrates an amplifier according to a first embodiment. Similar to the LNA in FIG. 2, the amplifier in FIG. 7 includes a source-grounded transistor N1, a gate-grounded transistor N2, a load resistor RL, a feedback path fb in which a resistor $R_{fb}$ and a capacitor $C_{dccut}$ are coupled, a gate bias voltage generator 30, and a supply resistor $R_{bias}$. The amplifier in FIG. 7 further includes a switch SW1 between a gate bias voltage output terminal 32 of the gate bias voltage generator 30 and a node n1 located on the side of an input terminal In of the feedback path fb.

When the amplifier in FIG. 7 starts to operate in response to a reception enable signal REN, the switch SW1 becomes temporarily conductive based on a setup signal ST and supplies a bias voltage $V_{bias}$ directly to the node n1. In the operating state in which the DC potential of the path in the amplifier in FIG. 7 is stable, the switch SW1 is non-conductive and the bias voltage of the gate bias voltage generator 30 is supplied to the node n1 through the supply resistor $R_{bias}$. As a result, the setup signal ST that controls the switch SW1 as described above is generated based on the reception enable signal REN.

Thus, when the amplifier in FIG. 7 is powered up in response to the reception enable signal REN, the switch SW1 becomes conductive and the gate bias voltage $V_{bias}$ is applied directly to the node n1. The feedback path fb may shorten the time that it takes for the DC potential of the path in the circuit to become stable and the time that it takes for the DC potential of each node in the amplifier in FIG. 7 to become stable. Thus, the feedback path fb may suppress the oscillation of the DC potential of each node by applying the gate bias voltage $V_{bias}$ directly to the node n1.

Figure 8:
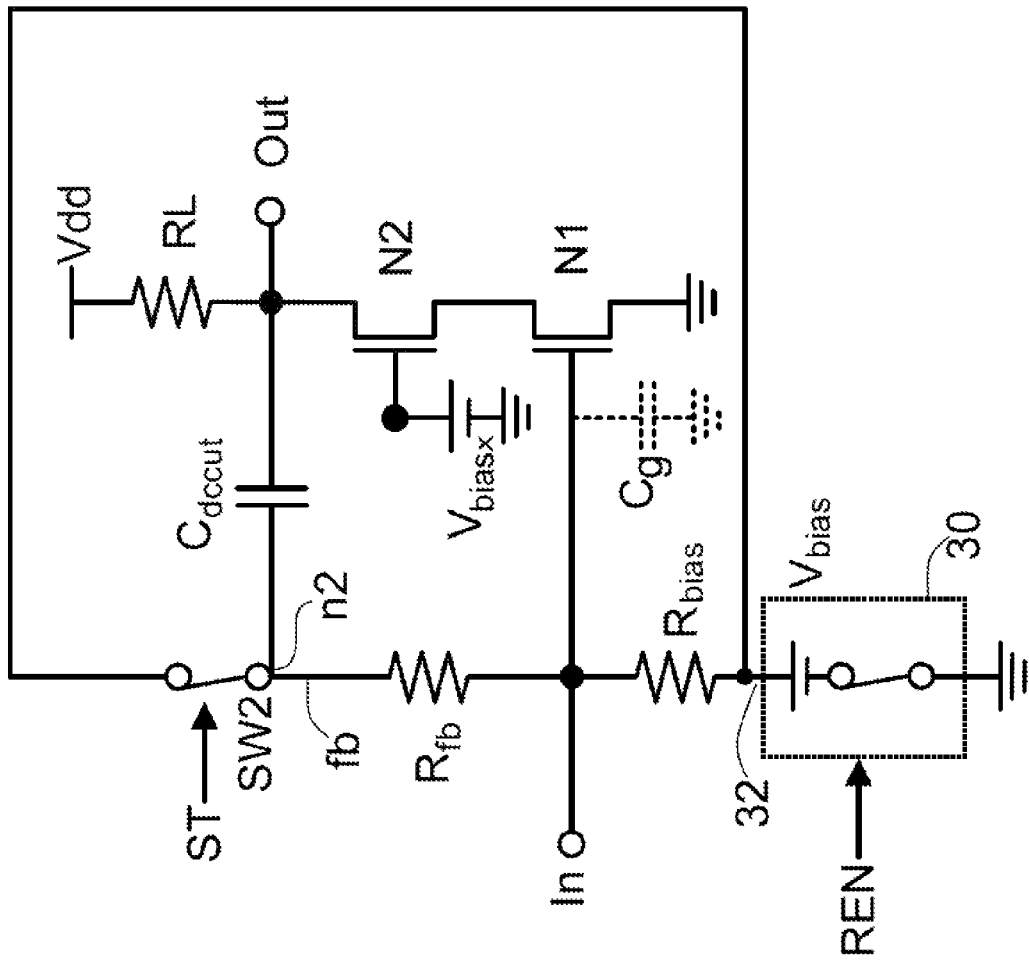
FIG. 8 illustrates an amplifier according to a second embodiment.

FIG. 8 illustrates an amplifier according to a second embodiment. Similar to the amplifier in FIG. 7, the amplifier in FIG. 8 also includes a source-grounded transistor N1, a gate-grounded transistor N2, a load resistor RL, a feedback path fb in which a resistor $R_{fb}$ and a capacitor $C_{dccut}$ are coupled in series, a gate bias voltage generator 30, and a supply resistor $R_{bias}$. The amplifier in FIG. 8 further includes a switch SW2 between a gate bias voltage output terminal 32 of the gate bias voltage generator 30, and a coupling node n2 of the resistor $R_{fb}$ and the capacitor $C_{dccut}$ that are provided in the feedback path fb. Similar to the switch SW1 in FIG. 7, the switch SW2 becomes temporarily conductive when the amplifier in FIG. 8 is powered up, and becomes non-conductive in the operating state thereafter.

Also in the second embodiment, since a gate bias voltage $V_{bias}$ is applied directly to the node n2 in the feedback path fb, the oscillation that may occur until the DC potential of each node in the amplifier becomes stable may be suppressed.

Figure 9:
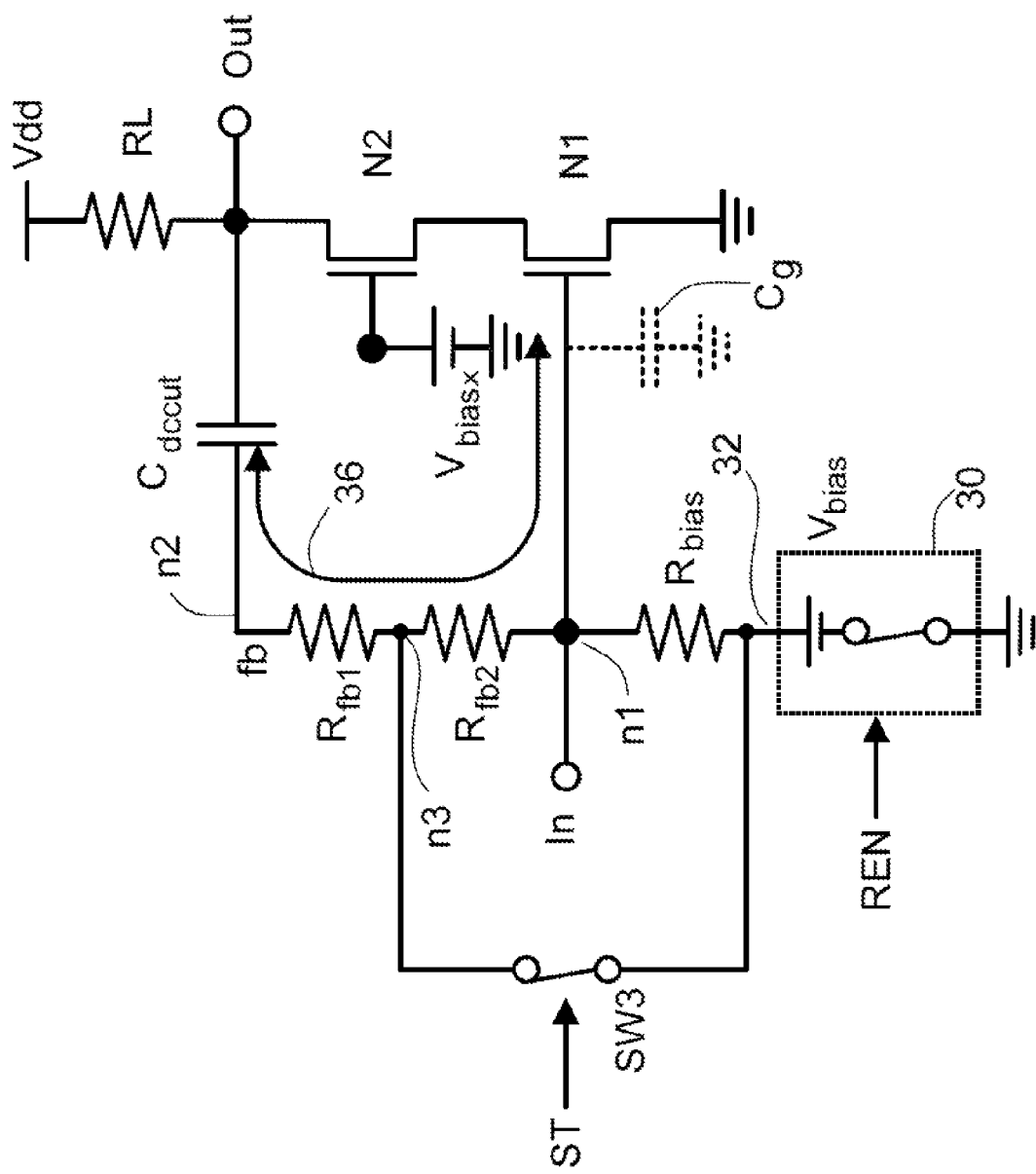
FIG. 9 illustrates an amplifier according to a third embodiment.

FIG. 9 illustrates an amplifier according to a third embodiment. Similar to the amplifier in FIG. 7, the amplifier in FIG. 9 also includes a source-grounded transistor N1, a gate-grounded transistor N2, a load resistor RL, a feedback path fb in which a resistor $R_{fb}$ and a capacitor $C_{dccut}$ are coupled in series, a gate bias voltage generator 30, and a supply resistor $R_{bias}$. The amplifier in FIG. 9 includes a switch SW3 between a gate bias voltage output terminal 32 of the gate bias voltage generator 30 and a node n3 in the resistor $R_{fb}$ in the feedback path fb. Similar to the switch SW1 in FIG. 7, the switch SW3 becomes temporarily conductive when the amplifier in FIG. 9 is powered up, and becomes non-conductive in the operating state thereafter.

Similar to the above, even when the resistor $R_{fb}$ in the feedback path fb is divided into resistors $R_{fb1}$ and $R_{fb2}$ and a gate bias voltage $V_{bias}$ is applied directly to the node n3, the time that it takes for the DC potential of each node in the amplifier to become stable may be shortened.

According to the first to third embodiments, the amplifier may reach the operating state in a shorter time by providing a switch for applying the gate bias voltage $V_{bias}$ directly to a node in the path extending from the gate of the source-grounded transistor N1 toward the capacitor $C_{dccut}$ through the resistor $R_{fb}$ in the feedback path fb (the path indicated by an arrow 36), such as any one of the nodes n1 to n3 in FIG. 9.

Figure 10:
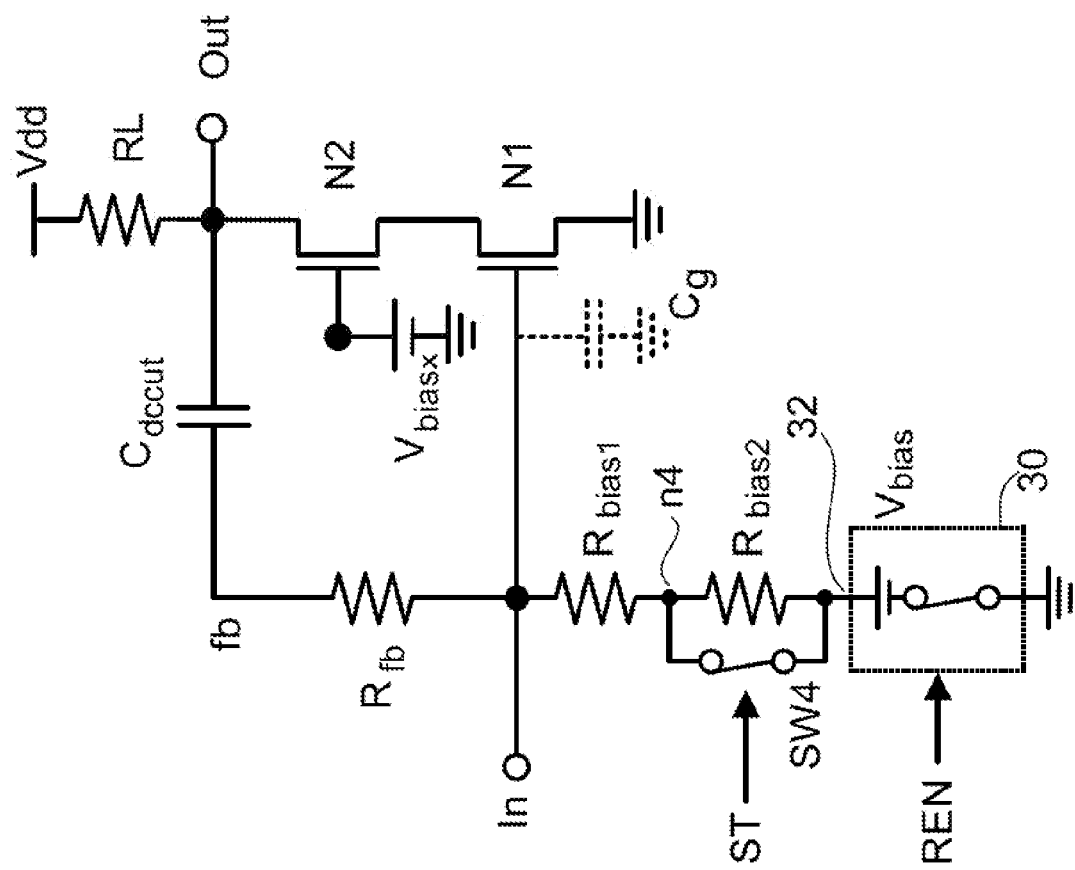
FIG. 10 illustrates an amplifier according to a fourth embodiment.

FIG. 10 illustrates an amplifier according to a fourth embodiment. The amplifier in FIG. 10 includes a switch SW4 provided between a gate bias voltage output terminal 32 of a gate bias voltage generator 30, and a coupling node n4 of supply resistors $R_{bias1}$ and $R_{bias2}$. Similar to the switch SW1 in FIG. 7, the switch SW4 becomes temporarily conductive when the amplifier in FIG. 10 is powered up and becomes non-conductive in the operating state thereafter.

In the fourth embodiment, even when the switch SW4 is conductive, a gate bias voltage $V_{bias}$ is not applied directly to a node in a feedback path fb. However, when the gate bias voltage $V_{bias}$ is applied directly to the node n4, the DC potential of each node becomes stable in a shorter time after the amplifier in FIG. 10 is powered up, compared with the amplifier in FIG. 2.

To shorten the time that it takes for the amplifier to reach the operating state, a switch for applying the gate bias voltage $V_{bias}$ directly to a node in the feedback path fb, which is DC-coupled to the gate of the source-grounded transistor N1, may be provided. However, use of the switch SW4 that lowers the resistance value of the supply resistor $R_{bias}$ when the amplifier in FIG. 10 is powered up also helps to shorten the time typically needed for the amplifier to reach the operating state.

Figure 11:
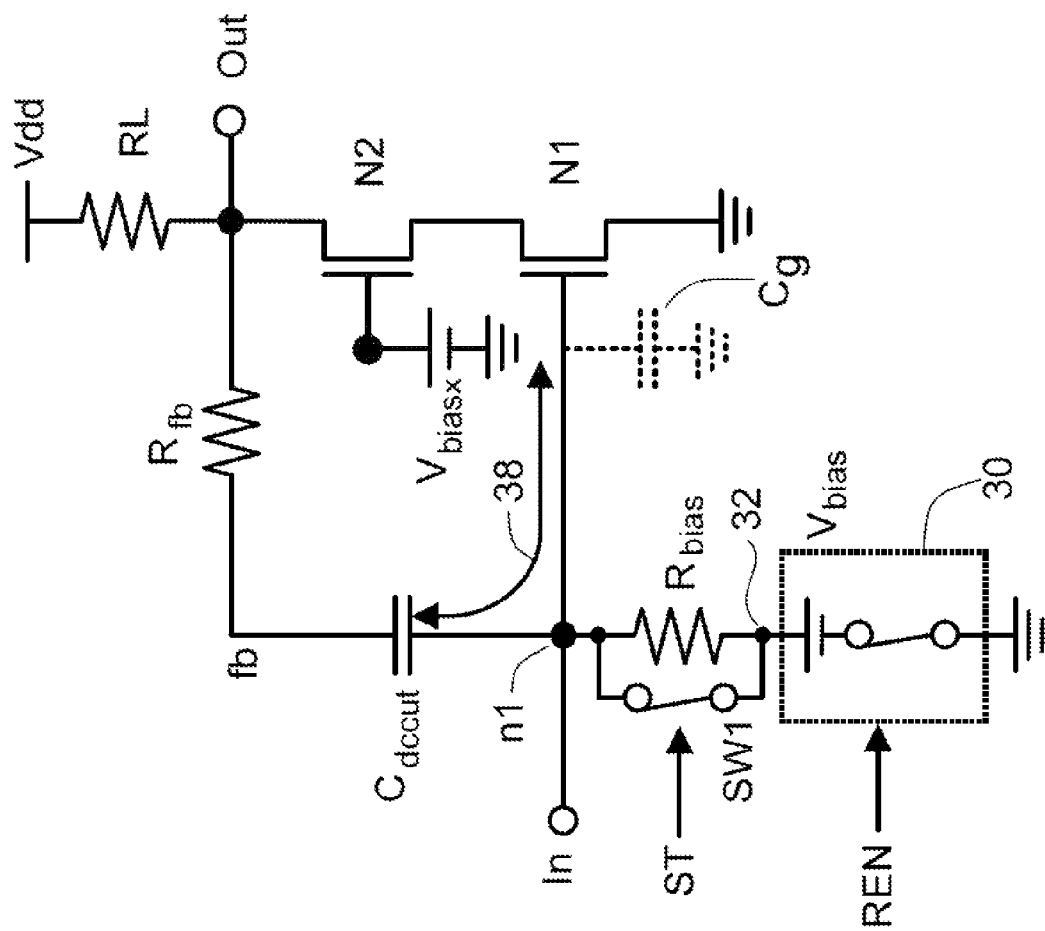
FIG. 11 illustrates an amplifier according to a fifth embodiment.

FIG. 11 illustrates an amplifier according to a fifth embodiment. Similar to the amplifier in FIG. 7, the amplifier in FIG. 11 includes a switch SW1. In a feedback path fb in FIG. 11, a resistor $R_{fb}$ and a capacitor $C_{dccut}$ are coupled in inverted positions of the positions thereof in FIG. 7. As described above, when the resistor $R_{fb}$ is coupled on the side of an output terminal Out, the switch SW1 for supplying the gate bias voltage $V_{bias}$ directly to a node n1 DC-coupled to the gate of a source-grounded transistor N1 is provided to shorten the time typically needed for the amplifier to reach the operating state than a switch for supplying the gate bias voltage $V_{bias}$ directly to the resistor $R_{fb}$. That is, a switch (for example, the switch SW1) is provided between the node n1 in the path indicated by an arrow 38 and a gate bias voltage output node 32.

According to the first to fifth embodiments, a switch for temporarily lowering the resistance value between the gate bias voltage output node 32 and the node to which the capacitor $C_{dccut}$ in the feedback path fb is coupled when the reception enable signal REN starts to be supplied, such as any one of the switches SW1 to SW5, is provided to shorten the time typically needed for the amplifier to reach the operating state. In other words, an enable switch is provided either between the gate bias voltage output node 32 and a node in the feedback path fb or between the gate bias voltage output node 32 and a node in the supply resistor $R_{bias}$.

Referring again to FIG. 2, the amplifier may reach the operating state in a shorter time by causing the supply resistor $R_{bias}$ to have a small resistance value. However, to match the input impedance $Z_{in}$ to 50Ω, the supply resistor $R_{bias}$ is set to have a high resistance as described above. Also, although the load resistor RL in FIG. 2 may be an inductance that becomes a load with respect to a high frequency element and becomes a short circuit with respect to a DC (low frequency) element so as to shorten the time typically needed for the amplifier to reach the operating state, such inductance may occupy a large area in an large-scale integrated circuit.

Figure 12:
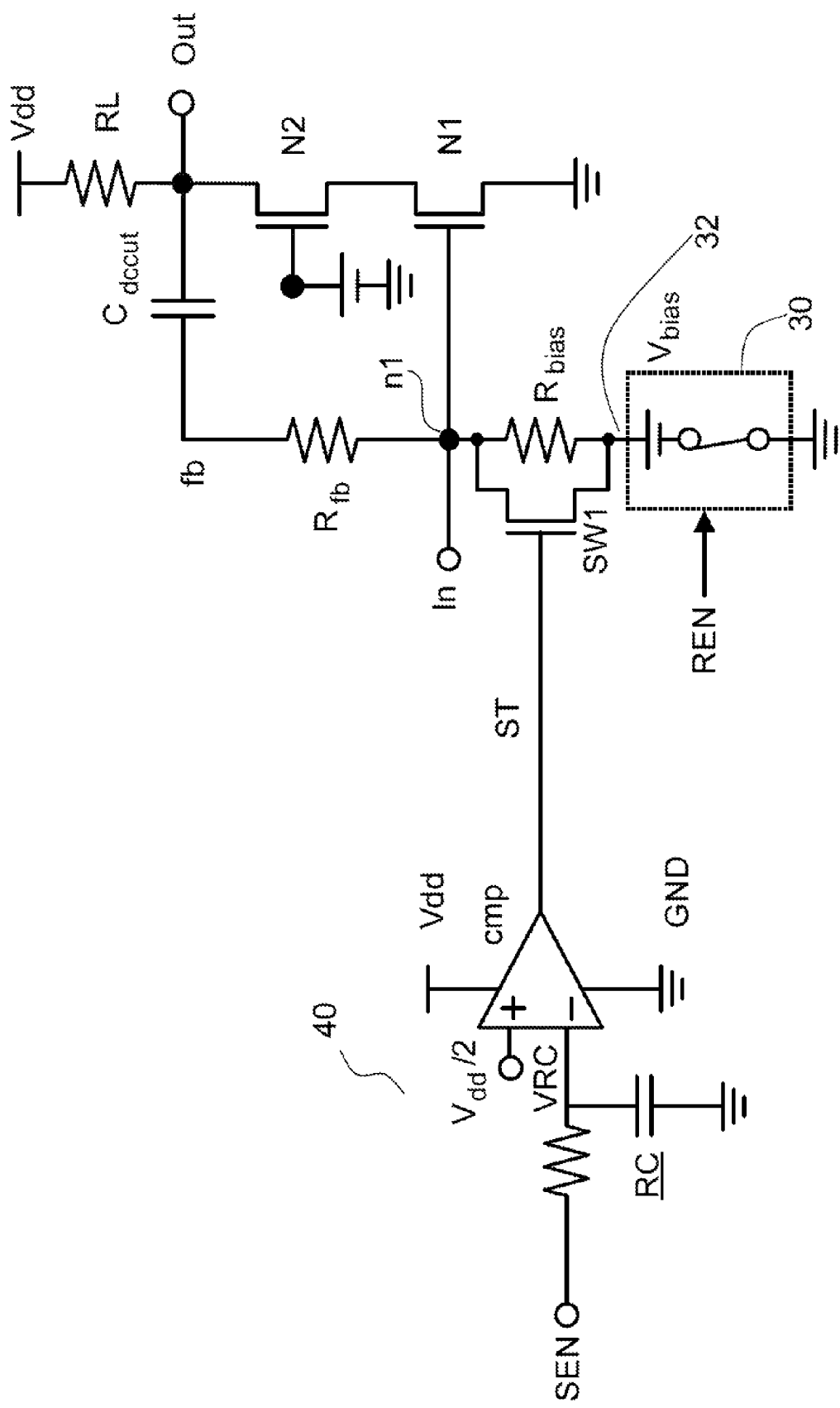
FIG. 12 illustrates the amplifier in FIG. 7 to which a setup signal generator is added.

FIG. 12 illustrates the amplifier in FIG. 7 to which a setup signal generator 40 for a setup signal ST is added. The setup signal generator 40 includes an RC delay circuit RC and a comparator cmp. The transmission enable signal SEN is input to a minus input terminal of the comparator cmp through the RC delay circuit RC and a reference voltage $V_{dd}/2$ is supplied to a plus input terminal of the comparator cmp. The switch SW1 may be an N-channel metal oxide semiconductor (NMOS) transistor, for example, and the conductive and non-conductive states of the switch SW1 are controlled based on the setup signal ST output from the comparator cmp to the gate of the switch SW1.

Figure 13:
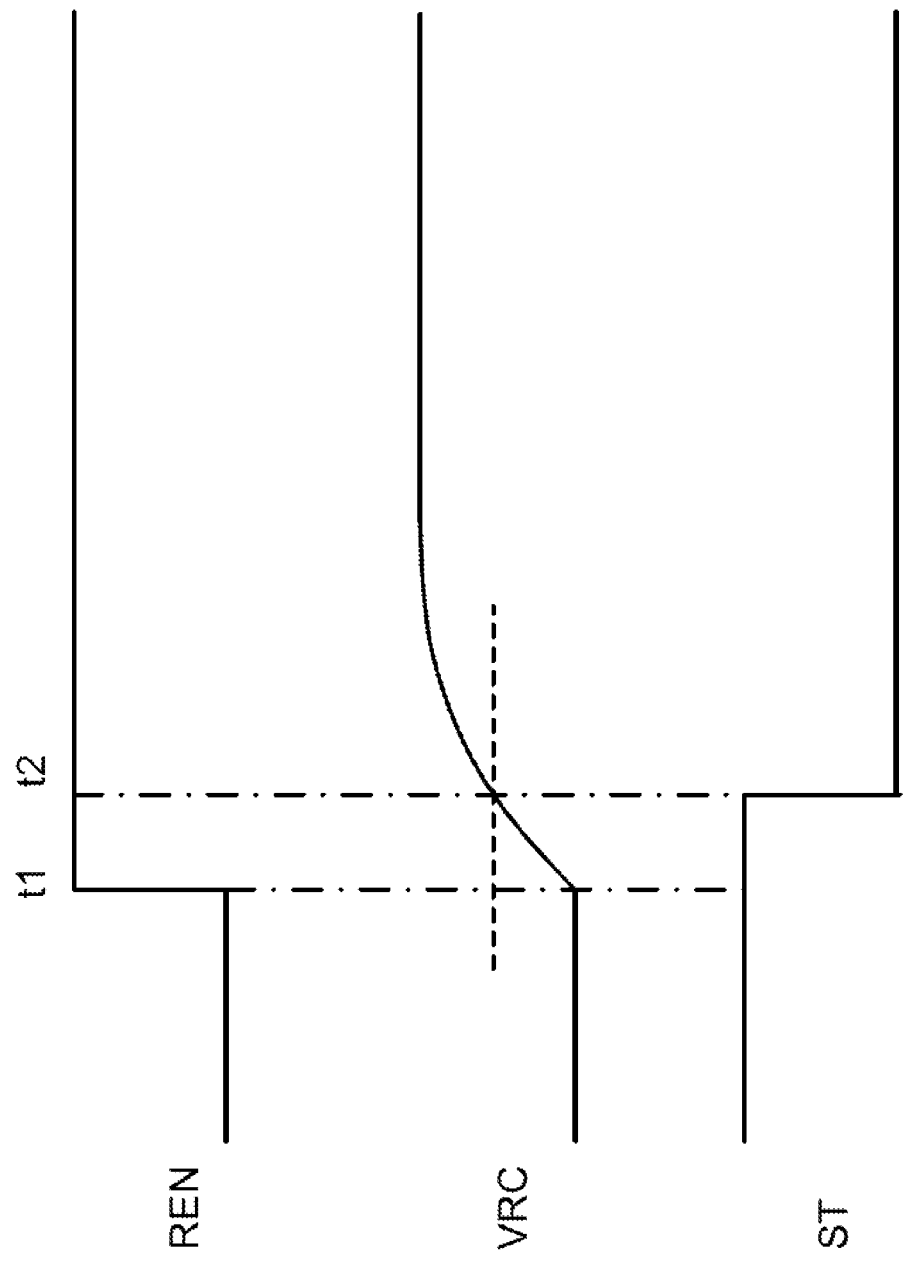
FIG. 13 illustrates operation waveforms of the setup signal generator in FIG. 12.

FIG. 13 illustrates operation waveforms of the setup signal generator 40 in FIG. 12. The reception enable signal REN is at the "L" level at or before the time t1 and an output VRC of the RC delay circuit RC is also at the "L" level, and the comparator cmp causes the setup signal ST to be the "H" level (the level of the power source Vdd). The switch SW1 is conductive when the setup signal ST is the "H" level.

At the time t1, the reception enable signal REN rises from the level of a ground potential to the level of the power supply voltage Vdd and the gate bias voltage generator 30 generates the gate bias voltage $V_{bias}$. The gate bias voltage $V_{bias}$ reaches a desired level in a relatively short time. Thus, the gate bias voltage $V_{bias}$ starts to be applied directly to the node n1 in the feedback path fb immediately after the time t1. As a result, the DC voltage of the node n1 is caused to be substantially the same as the gate bias voltage $V_{bias}$.

In response to the rise of the reception enable signal REN, the output voltage VRC of the RC delay circuit RC gradually rises based on an RC time constant. When the output voltage VRC exceeds the reference voltage $V_{dd}/2$ at the time t2, the comparator cmp causes the setup signal ST to reach the "L" level. As a result, the switch SW1 becomes non-conductive. That is, the amplifier enters the operating state and the gate bias voltage $V_{bias}$ is applied to the input terminal In coupled to the gate of the transistor N1 through the supply resistor $R_{bias}$.

The setup signal ST described above may transition from the "H" level to the "L" level after a given period of time in response to the rise of the reception enable signal REN. As long as the setup signal generator 40 is a circuit that generates the setup signal ST, the use of the comparator cmp in FIG. 12 may be optional.

Figure 14:
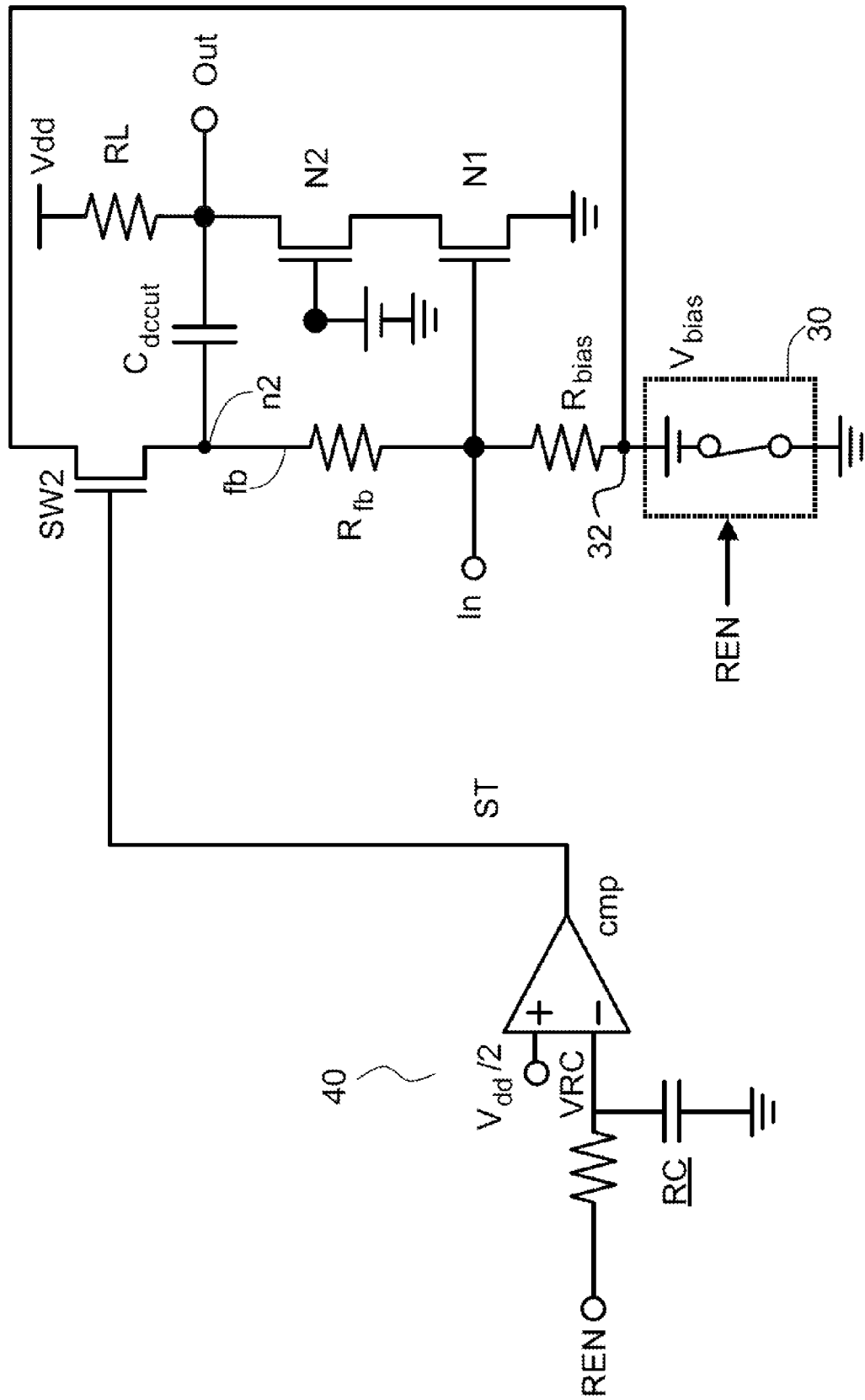
FIG. 14 illustrates the amplifier in FIG. 8 to which a setup signal generator is added.

FIG. 14 illustrates the amplifier in FIG. 8 to which a setup signal generator 40 is added. Operations of the setup signal generator 40 in FIG. 14 are substantially the same as those of the setup signal generator 40 in FIG. 12. The setup signal ST is supplied to the gate of the switch SW2, which may be an NMOS transistor, for example.

Figure 15:
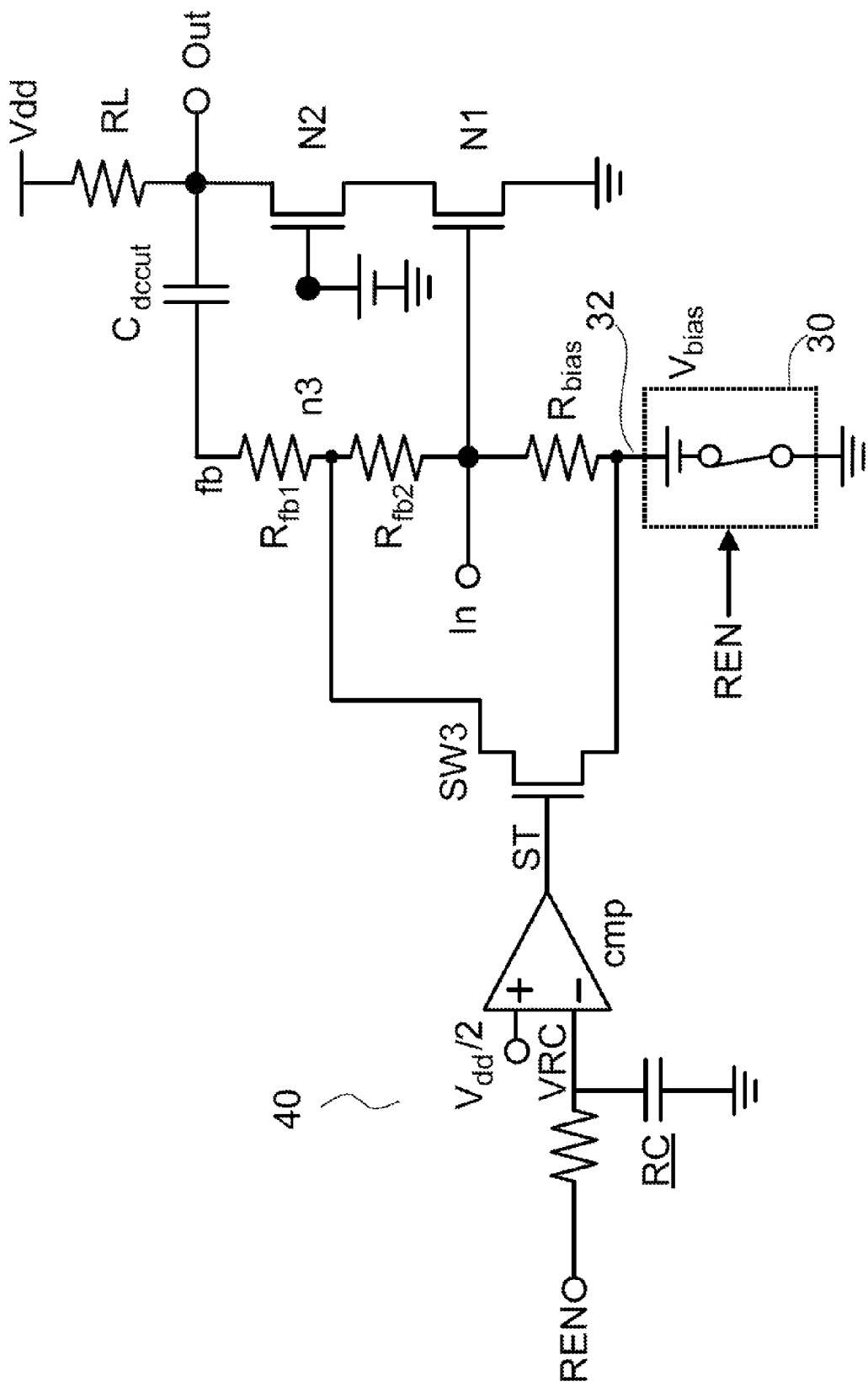
FIG. 15 illustrates the amplifier in FIG. 9 to which a setup signal generator is added.

FIG. 15 illustrates the amplifier in FIG. 9 to which a setup signal generator 40 is added. Operations of the setup signal generator 40 in FIG. 15 are substantially the same as those of the setup signal generator 40 in FIG. 12. The setup signal ST is supplied to the gate of the switch SW2, which may be an NMOS transistor, for example.

Figure 16:
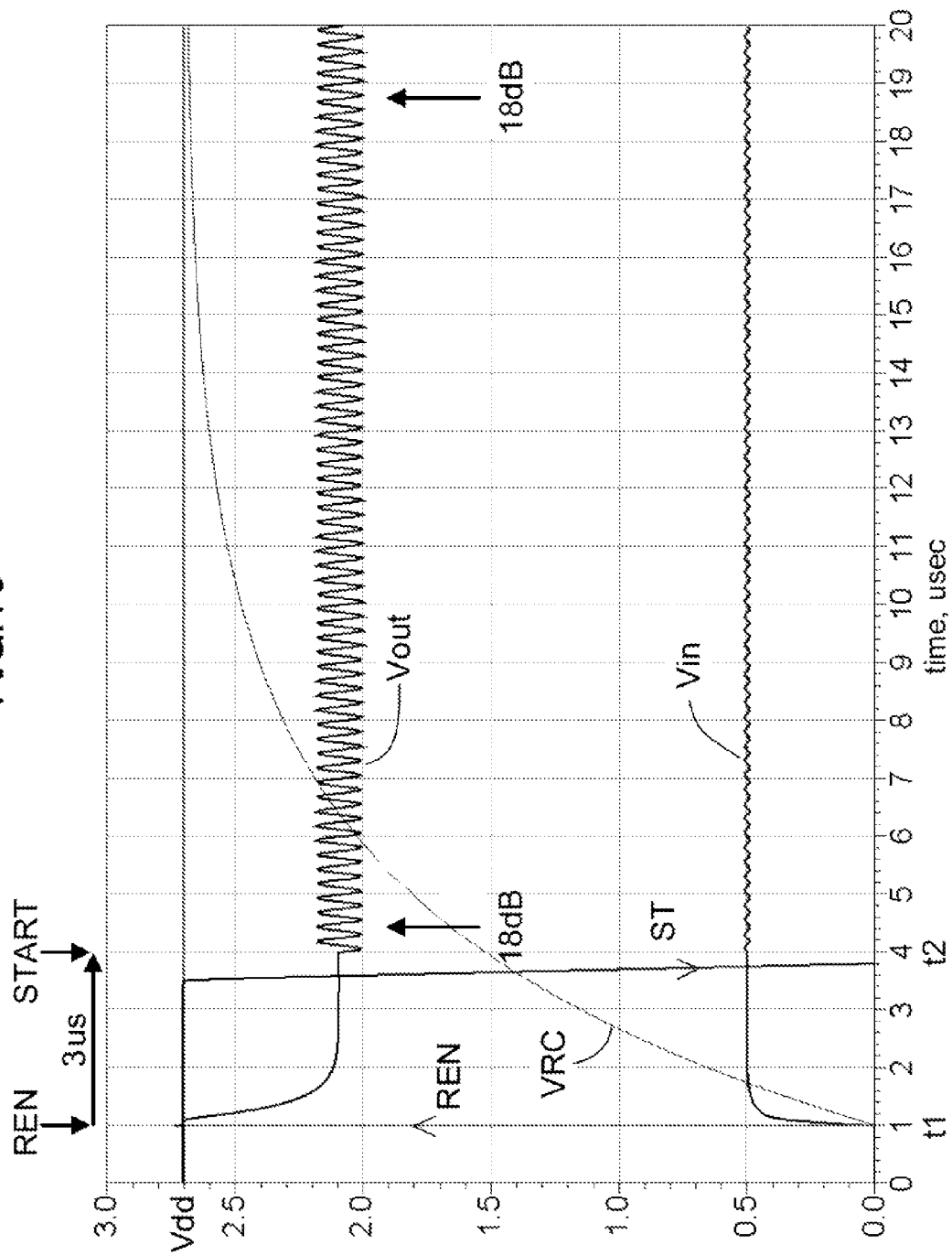
FIG. 16 illustrates results of simulations performed for the amplifier in FIG. 7.
Figure 17:
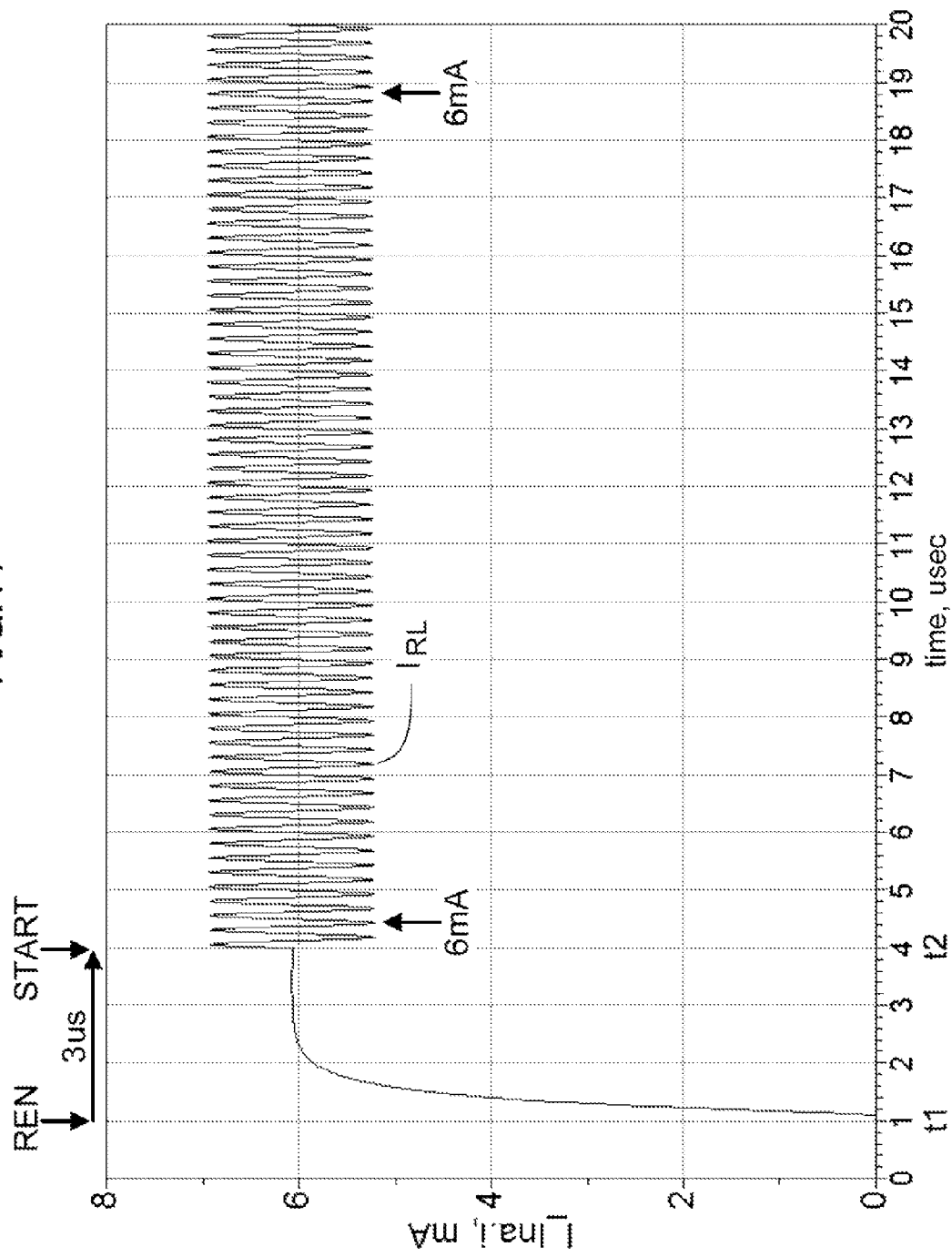
FIG. 17 illustrates results of simulations performed for the amplifier in FIG. 8.

FIGS. 16 and 17 illustrate results obtained through the simulations performed for the amplifiers according to the first and second embodiments described above. As demonstrated in FIG. 16, the reception enable signal REN reaches the "H" level at the time t1 (1 μsec) and the output voltage VRC of the RC delay circuit RC gradually increases in response to the "H" level reception enable signal REN, and the setup signal ST reaches the "L" level at the time t2 (4 μsec). As is apparent when compared with FIG. 5, the input voltage Vin applied to the gate of the source-grounded transistor N1 becomes 0.5 V in a shorter time and the output voltage Vout becomes approximately 2.1 V in a shorter time. After that, the input voltage Vin and the output voltage Vout are maintained within desired levels. Already at the time t2, the gain that may be obtained based on the input voltage Vin and the output voltage Vout reaches 18 dB, which corresponds to the operating state. That is, when the amplifier is used as an LNA in a receiver, the amplifier may transition from the transmission state to the reception state in a shorter time and be ready for the reception operations.

As demonstrated in FIG. 17, compared with FIG. 6, the current $I_{RL}$ flowing to the load resistor RL rapidly increases at the time t1 and the amplitude of the current $I_{RL}$ is already 6 mA at the time t2.

Thus, each of the amplifiers according to the first and second embodiments may reach the operating state in a shorter time by applying the gate bias voltage $V_{bias}$ directly to a node in the feedback path indicated by the arrow 36 in FIG. 9 or the arrow 38 in FIG. 11 when the amplifier is powered up. Similar results may be obtained when the simulations are performed for the amplifier in FIG. 9 according to the third embodiment or the amplifier in FIG. 10 according to the fourth embodiment.

As described above, the amplifier according to an embodiment of the present invention may reach the operating state in a shorter time after the amplifier is powered up, based on the supply of the gate bias voltage generated by the gate bias voltage generator. As a result, when the amplifier is used in a receiver in a communication apparatus, the amplifier may be switched from the transmission state to the reception state in a shorter time.

Although the embodiments of the present invention are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An amplifier comprising:
    a first transistor including a gate coupled to an input terminal and a grounded source;
    a load resistor provided between a drain of the first transistor and a power supply;
    an output terminal coupled to a node between the drain of the first transistor and the load resistor;
    a feedback path coupled to the input terminal and the output terminal and including a resistor and a capacitor;
    a bias voltage generator applying a gate bias voltage to the gate of the first transistor in response to a first enable signal;
    a supply resistor provided between an output node for the gate bias voltage of the bias voltage generator and the gate of the first transistor; and
    an enable switch lowering a resistance value between the output node for the gate bias voltage and a node in the feedback path.

2. The amplifier according to claim 1, comprising:
    a second transistor cascode-coupled between the drain of the first transistor and the load resistor and including a gate to which a given bias voltage is supplied.

3. The amplifier according to claim 1,
wherein the enable switch is provided between the output node for the gate bias voltage and the input terminal, becomes temporarily conductive in response to a setup signal, and becomes non-conductive in an operating state.

4. The amplifier according to claim 1,
wherein the enable switch is provided between the output node for the gate bias voltage and a node in the feedback path, the enable switch becoming temporarily conductive in response to a setup signal and becoming non-conductive in an operating state.

5. The amplifier according to claim 1,
wherein the enable switch is provided between the output node for the gate bias voltage and a node in the supply resistor, becomes temporarily conductive in response to a setup signal, and becomes non-conductive in an operating state.

6. The amplifier according to claim 1,
wherein the input terminal receives a high frequency signal through a band pass filter, and
wherein an input impedance of the input terminal matches an output impedance of the band pass filter.

7. The amplifier according to claim 3, comprising:
a setup signal generator generating the setup signal, the setup signal causing the enable switch to be conductive before the enable signal starts to be supplied and causing the enable switch to be non-conductive after a given time after the enable signal starts to be supplied.

8. An amplifier comprising:
a first transistor a gate of which is coupled to an input terminal and a source of which is grounded;
a second transistor cascode-coupled on the side of a drain of the first transistor and including a gate to which a given bias voltage is supplied;
a load resistor provided between a drain of the second transistor and a power supply;
an output terminal coupled to a node between the drain of the second transistor and the load resistor;
a feedback path coupled to the input terminal and the output terminal and including a resistor and a capacitor;
a bias voltage generator applying a gate bias voltage to the gate of the first transistor in response to an enable signal;
a supply resistor provided between an output node for the gate bias voltage of the bias voltage generator and the gate of the first transistor; and
an enable switch provided between the output node for the gate bias voltage and a node in the feedback path or a node between the input terminal and the gate of the first transistor, the enable switch becoming temporarily conductive in response to a setup signal and becoming non-conductive in an operating state.

9. The amplifier according to claim 8,
wherein the input terminal receives a high frequency signal through a band pass filter, and
wherein an input impedance of the input terminal matches an output impedance of the band pass filter.

10. The amplifier according to claim 8, further comprising:
a setup signal generator generating the setup signal, the setup signal causing the enable switch to be conductive before the enable signal starts to be supplied and causing the enable switch to be non-conductive after a given time after the enable signal starts to be supplied.

11. A communication apparatus comprising:
a transmission and reception terminal;
an amplifier on a reception side to which a signal received at the transmission and reception terminal is supplied through a first band pass filter; and
an amplifier on a transmission side, outputting an output signal to the transmission and reception terminal through a second band pass filter;
wherein the amplifier on the reception side includes:
an input terminal to which the received signal is input;
a first transistor including a gate coupled to the input terminal and a grounded source;
a load resistor provided between a drain of the first transistor and a power supply;
an output terminal coupled to a node between the drain of the first transistor and the load resistor;
a feedback path coupled to the input terminal and the output terminal and including a resistor and a capacitor;
a bias voltage generator applying a gate bias voltage to the gate of the first transistor in response to an enable signal;
a supply resistor provided between an output node for the gate bias voltage of the bias voltage generator and the gate of the first transistor; and
an enable switch lowering a resistance value between the output node for the gate bias voltage and a node in the feedback path.

12. The communication apparatus according to claim 11, wherein the amplifier on the reception side further includes:
a second transistor cascode-coupled between the drain of the first transistor and the load resistor and including a gate to which a given bias voltage is supplied.

13. The communication apparatus according to claim 11, wherein
wherein the enable switch is provided between the output node for the gate bias voltage and the input terminal, becomes temporarily conductive in response to a setup signal, and becomes non-conductive in an operating state.

14. The communication apparatus according to claim 11,
wherein the enable switch is provided between the output node for the gate bias voltage and a node in the feedback path, the enable switch becoming temporarily conductive in response to a setup signal and becoming non-conductive in an operating state.

15. The communication apparatus according to claim 11,
wherein the enable switch is provided between the output node for the gate bias voltage and a node in the supply resistor, becomes temporarily conductive in response to a setup signal, and becomes non-conductive in an operating state.

16. The communication apparatus according to claim 11, further comprising:
a setup signal generator generating a setup signal, the setup signal causing the enable switch to be conductive before the enable signal starts to be supplied and causing the enable switch to be non-conductive after a given time after the enable signal starts to be supplied.

* * * * *